US008642433B2

(12) United States Patent
Zhong et al.

(10) Patent No.: US 8,642,433 B2
(45) Date of Patent: Feb. 4, 2014

(54) METHOD FOR MANUFACTURING SEMICONDUCTOR DEVICE

(75) Inventors: Huicai Zhong, San Jose, CA (US); Jun Luo, Beijing (CN); Chao Zhao, Kessel-lo (BE); Qingqing Liang, Lagrangeville, NY (US)

(73) Assignee: Institute of Microelectronics, Academy of Sciences, Beijing (CN)

( * ) Notice: Subject to any disclaimer, the term of this patent is extended or adjusted under 35 U.S.C. 154(b) by 0 days.

(21) Appl. No.: 13/509,551

(22) PCT Filed: Dec. 5, 2011

(86) PCT No.: PCT/CN2011/083471
§ 371 (c)(1),
(2), (4) Date: May 11, 2012

(87) PCT Pub. No.: WO2013/023417
PCT Pub. Date: Feb. 21, 2013

(65) Prior Publication Data
US 2013/0045588 A1    Feb. 21, 2013

(51) Int. Cl.
*H01L 21/336* (2006.01)
*H01L 21/477* (2006.01)

(52) U.S. Cl.
USPC ..... 438/299; 438/655; 438/682; 257/E21.438

(58) Field of Classification Search
USPC ......... 438/581, 583, 649, 664, 682, 683, 721, 438/755
See application file for complete search history.

(56) References Cited

U.S. PATENT DOCUMENTS

| | | | | |
|---|---|---|---|---|
| 4,933,994 A | * | 6/1990 | Orban | 438/232 |
| 6,150,243 A | * | 11/2000 | Wieczorek et al. | 438/558 |
| 6,171,919 B1 | * | 1/2001 | Besser et al. | 438/305 |
| 6,184,097 B1 | * | 2/2001 | Yu | 438/299 |
| 6,204,136 B1 | * | 3/2001 | Chan et al. | 438/305 |
| 6,242,785 B1 | * | 6/2001 | Hossain et al. | 257/412 |
| 6,271,095 B1 | * | 8/2001 | Yu | 438/302 |
| 6,368,949 B1 | * | 4/2002 | Chen et al. | 438/592 |
| 6,461,923 B1 | * | 10/2002 | Hui et al. | 438/305 |
| 6,492,670 B1 | | 12/2002 | Yu | |

(Continued)

OTHER PUBLICATIONS

Yi et al., Method for characterizing self-assembled monolayers as antirelaxation wall coatings for alkali vapor cells, Journal of Applied Physics, 104, 023534, 2008, pp. 1-7.*

(Continued)

*Primary Examiner* — David Vu
*Assistant Examiner* — Earl Taylor
(74) *Attorney, Agent, or Firm* — Goodwin Procter LLP (57) ABSTRACT

A method for manufacturing a semiconductor device is disclosed, comprising: providing a substrate, a gate region on the substrate and a semiconductor region at both sides of the gate region; forming sacrificial spacers, which cover a portion of the semiconductor region, on sidewalls of the gate region; forming a metal layer on a portion of the semiconductor region outside the sacrificial spacers and on the gate region; removing the sacrificial spacers; performing annealing so that the metal layer reacts with the semiconductor region to form a metal-semiconductor compound layer on the semiconductor region; and removing unreacted metal layer. By separating the metal layer from the channel and the gate region of the device with the thickness of the sacrificial spacers, the effect of metal layer diffusion on the channel and the gate region is reduced and performance of the device is improved.

11 Claims, 5 Drawing Sheets

(56) References Cited

U.S. PATENT DOCUMENTS

| | | | |
|---|---|---|---|
| 8,067,280 B2* | 11/2011 | Wang et al. | 438/217 |
| 8,101,518 B2* | 1/2012 | Cabral et al. | 438/653 |
| 8,242,501 B2* | 8/2012 | Hirai | 257/57 |
| 2006/0014387 A1* | 1/2006 | Robertson et al. | 438/682 |
| 2008/0233488 A1* | 9/2008 | Chang | 430/5 |
| 2008/0274611 A1* | 11/2008 | Cabral et al. | 438/653 |
| 2008/0305590 A1* | 12/2008 | Wang et al. | 438/217 |
| 2009/0004853 A1* | 1/2009 | Bu et al. | 438/664 |
| 2009/0258238 A1* | 10/2009 | Li et al. | 428/450 |
| 2010/0173494 A1* | 7/2010 | Kobrin | 438/694 |

OTHER PUBLICATIONS

Int'l Search Report (May 24, 2012).
Written Opinion (May 24, 2012).

* cited by examiner

FIG. 1

```
S1: provide a substrate, a gate region on the substrate and a
semiconductor region at both sides of the gate region
            │
            ▼
S2: form sacrificial spacers, which cover a portion of the
semiconductor region, on sidewalls of the gate region
            │
            ▼
S3: form a metal layer on a portion of the semiconductor
region outside the sacrificial spacers and on the gate
region
            │
            ▼
S4: remove the
sacrificial spacers
            │
            ▼
S5: perform annealing to form a metal-
semiconductor compound layer
            │
            ▼
S6: remove unreacted
metal layer
```

METHOD FOR MANUFACTURING SEMICONDUCTOR DEVICE

This application is a U.S. National Stage application of, and claims priority to, International Application No. PCT/CN2011/083,471 filed on Dec. 5, 2011, which claimed priority to Chinese Patent Application No. 201110236626.9 filed with the State Intellectual Property Office on Aug. 17, 2011. Both the international application and the Chinese application are incorporated herein by reference in their entireties.

FIELD OF THE INVENTION

The present invention relates to the field of semiconductor manufacturing technology, and more particularly to a method for manufacturing a semiconductor device.

BACKGROUND OF THE INVENTION

Currently, Complementary Metal-Oxide-Semiconductor (CMOS) manufacturing techniques generally comprise forming a metal-semiconductor compound on a source/drain region by the process of Self-Aligned Silicide (SALICIDE), in order to reduce the contact resistance between the contact and the source/drain region. However, with the rapid development of semiconductor technology, the critical dimension of devices continues to shrink and performance requirements of the devices have become increasingly higher. Hence, it is desired to use a metal of a smaller resistivity to form the metal-semiconductor compound, in order to reduce the contact resistance.

Due to the features of Nickel (Ni) and Nickel-Platinum alloy (Ni—Pt) such as low resistivity, low-temperature formation and low contact resistance, current advanced techniques commonly use Ni or Ni—Pt to form a Ni or Ni—Pt silicide by a self-aligned process.

As an example, in the case of forming a CMOS device on a silicon substrate, the self-aligned process for forming a Ni or Ni—Pt silicide comprises the steps of: depositing Ni or Ni—Pt when a gate region and a source/drain region have been formed; performing first low-temperature annealing at a temperature of about 300° C., so that the Ni or Ni—Pt on the source/drain region reacts with the silicon substrate to form a Ni-rich silicide; then removing unreacted Ni or Ni—Pt; and performing second high-temperature annealing at a temperature of about 450-500° C. so that the Ni-riched silicide are further transformed into a Ni or Ni—Pt silicide of a lower resistivity.

Figure 1:
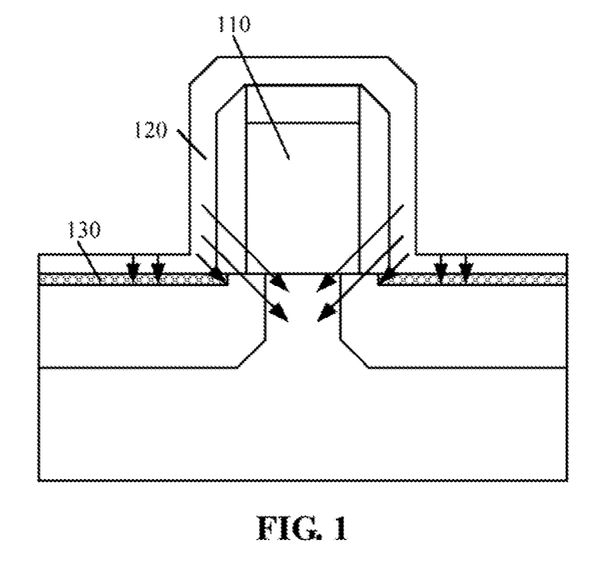
FIG. 1 is a schematic diagram of lateral diffusion of a metal-semiconductor compound formed according to the prior art.

However, the process above for forming a Ni or Ni—Pt silicide has a problem. Due to easily diffusing of Ni and Ni—Pt, lateral diffusion of Ni or Ni—Pt occurs in the self-aligned process. As shown in FIG. 1, Ni or Ni—Pt material 120 may diffuse to a gate region 110 inside the spacer and a channel region (the region under the gate region and between source and drain regions). As a result, the formed silicide 130 may extend toward the channel region, which may severely affect performance of the device as the dimensions of the device and the dimensions of the gate and the channel decrease. For example, significant gate leakage current, connection between source and drain regions, and device reliability issues may arise.

SUMMARY OF THE INVENTION

According to an embodiment of the present invention, it is provided a method for manufacturing a semiconductor device, which may reduce the lateral diffusion of metal during the self-aligned process for forming a metal-semiconductor compound, and improve performance of the device.

In order to realize the object above, according to an embodiment of the present invention, it is provided a technical solution below:

A method for manufacturing a semiconductor device, comprising:

providing a substrate, a gate region on the substrate and a semiconductor region at both sides of the gate region;

forming sacrificial spacers, which cover a portion of the semiconductor region, on sidewalls of the gate region;

forming a metal layer on a portion of the semicondUctor region outside the sacrificial spacers and on the gate region;

removing the sacrificial spacers;

performing annealing so that the metal layer reacts with the semiconductor region to form a metal-semiconductor compound layer on the semiconductor region; and removing unreacted metal layer.

Optionally, the metal layer is a metal material comprising Ni.

Optionally, the metal layer comprises Ni, an Ni—Pt alloy, or a combination thereof.

Optionally, the semiconductor region comprises: Si, SiGe, SiC, InAs, GaN, AlGaN, InP, or any combination thereof.

Optionally, the semiconductor region is a source/drain region on a doped substrate, a source/drain region embedded in the substrate, or a semiconductor layer on the substrate.

Optionally, the formed sacrificial spacers are Octadecyl-Trichlorosilane (OTS) sacrificial spacers or Dodecyltrichlorosilane (DTS) sacrificial spacers.

Optionally, the OTS sacrificial spacers are formed by: placing the gate region and the semiconductor region into an OTS solution to form an OTS film on a surface of the semiconductor region and a surface of the gate region; and selectively removing the OTS film so as to form the OTS sacrificial spacers, which cover a portion of the semiconductor region, on sidewalls of the gate region.

Optionally, the metal layer is formed by selectively forming the metal layer on a portion of the semiconductor region outside the sacrificial spacers and on the gate region.

Optionally, the annealing is performed at a temperature ranging from about 200 to 500° C.

Optionally, the annealing is performed for a period of time ranging from about 5 to 10 seconds.

In comparison with the prior all, the technical solution above may bring the following advantages:

In the method for manufacturing a semiconductor device according to the present invention, sacrificial spacers are formed on the sidewalls of the gate region before deposition of the metal material, and the sacrificial spacers are removed after a metal layer is formed on the substrate outside the sacrificial spacers, as a result, there is a distance between the metal layer and the gate region. By separating the metal layer from the channel and the gate region of the device with the thickness of the sacrificial spacers, the effect of metal layer diffusion on the channel and the gate region is reduced and performance of the device is improved.

BRIEF DESCRIPTION OF THE DRAWINGS

The above and other objects, features and advantages of the present invention will become more apparent when read in conjunction with the accompanying drawings, in which the same reference numerals denote the same components. The figures are not drawn to scale, in order to not unnecessarily obscure the essence of the present invention.

DETAILED DESCRIPTION OF THE INVENTION

For a better understanding of the objects, features and advantages above of the present invention, the embodiments of the present invention will be described hereinafter in detail with reference to the accompanying drawings.

Numerous specific details are set forth in the following descriptions, in order to provide a thorough understanding of the present invention. It will be apparent to one skilled in the art that the present invention may be practiced without these specific details, and that equivalents to the present invention may be obtained without deviation from the essence of the present invention. Hence, the present invention is not limited to the embodiments disclosed herein.

In addition, the present invention is described in detail in conjunction with the accompanying drawings. In the detailed descriptions of the embodiments of the present invention, for illustrative purposes, the sectional views illustrating device structures may be enlarged locally without maintaining their normal proportions; and the accompanying drawings are merely examples, which should not be considered as limiting the scope of protection of the present invention. Moreover, in an actual manufacturing process, three dimensions, i.e., length, width and depth, should be included.

As described in the "background of the invention", when Ni or an Ni—Pt alloy is used to form a silicide by a self-aligned process, due to easy diffuse of Ni and Ni—Pt, lateral diffusion of Ni or Ni—Pt to the gate region or the channel region may occur in the self-aligned process, which may cause degradation of performance of the device.

According to an aspect of the present invention, it is provided a method for manufacturing a semiconductor device in which the metal-semiconductor compound is formed by a self-aligned process. Sacrificial spacers are formed on the sidewalls of the gate region before deposition of the metal material, and the sacrificial spacers are removed after a metal layer is formed on the substrate outside the sacrificial spacers, as a result, the metal layer is separated from the channel and the gate region of the device with the thickness of the sacrificial spacers. Hence, the effect of metal layer diffusion on the channel and the gate region is reduced and performance of the device is improved. The method for manufacturing a semiconductor device comprises:

providing a substrate, a gate region on the substrate and a semiconductor region at both sides of the gate region;

forming sacrificial spacers, which cover a portion of the semiconductor region, on sidewalls of the gate region;

forming a metal layer on a portion of the semiconductor region outside the sacrificial spacers and on the gate region;

removing the sacrificial spacers;

performing annealing so that the metal layer reacts with the semiconductor region to form a metal-semiconductor compound layer on the semiconductor region; and removing unreacted metal layer.

It should be noted that in the present application, the gate region comprises at least a gate electrode and a gate dielectric layer, and may further comprise spacers on the sidewalls of the gate electrode.

Figure 2:
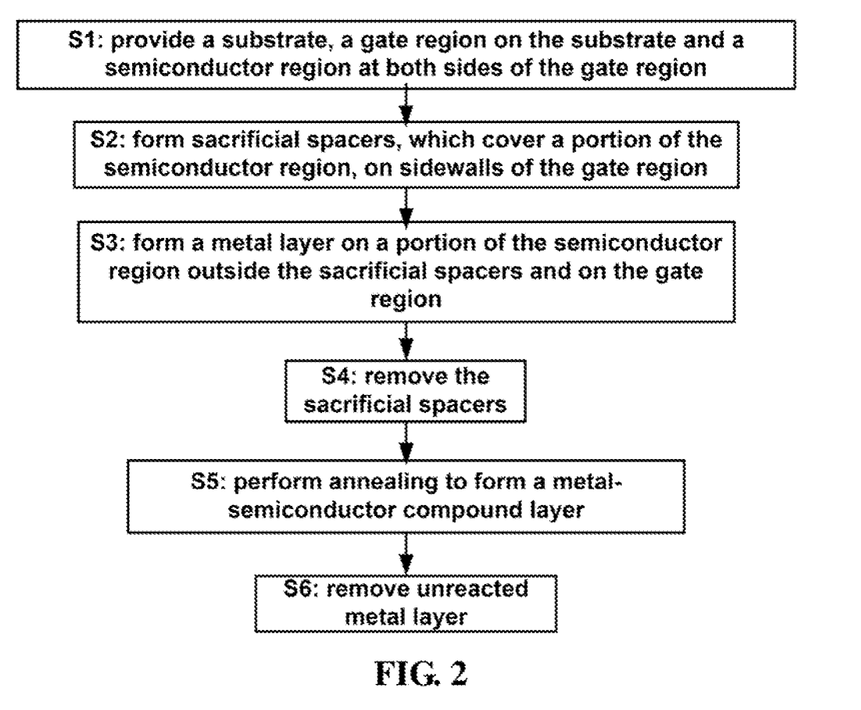
FIG. 2 is a flow chart of a method for manufacturing a semiconductor device according to an embodiment of the present invention.

As shown in FIG. 2 which illustrates a flow chart of a method for manufacturing a semiconductor device according to an embodiment of the present invention, the method will be described hereinafter in detail in conjunction with the flow chart and the schematic diagrams of the embodiment of the present invention.

At step S1, a substrate 200 is provided. A gate region 210 is formed on the substrate 200, and a semiconductor region 212 containing Si is formed at both sides of the gate region 210, as shown in FIG. 3.

According to an embodiment of the present invention, the substrate 200 may comprise any semiconductor material, e.g., monocrystalline silicon, polysilicon, amorphous silicon, germanium, silicon-germanium, silicon carbide, indium antimonide, lead telluride, indium arsenide, indium phosphide, gallium arsenide or gallium antimonide, an alloy semiconductor, or other compound semiconductors. The substrate 200 may also have a multi-layered semiconductor structure, e.g., Si/SiGe, Silicon On Insulator (SOI) or Silicon-Germanium On Insulator (SGOI). It should be noted that these are only examples, and should not be considered as limiting the present invention.

Figure 3:
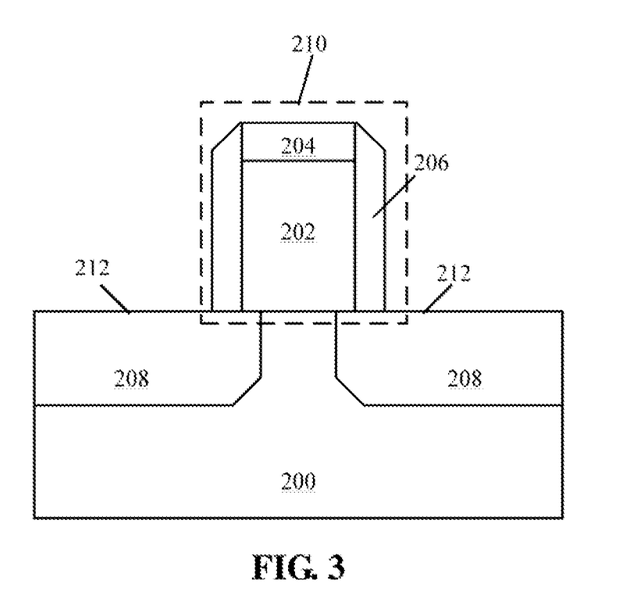
FIGS. 3-9 are schematic diagrams illustrating a method for manufacturing a semiconductor device according to an embodiment of the present invention.

According to an embodiment of the present invention, as shown in FIG. 3, the gate region 200 may comprise at least a gate electrode and a gate dielectric layer 202 (in the figure, the gate electrode and the gate electric layer are shown as one layer), and may further comprise spacers 206 on the sidewalls of the gate electrode and gate dielectric layer 202 and/or a cap layer 204 on the gate electrode. The spacers may be formed by a dielectric material such as $SiO_2$ or $Si_3N_4$; the gate dielectric layer may comprise silicon dioxide or a high dielectric constant (high-K) dielectric material; and the gate electrode may have a one-layer or multi-layered structure which may comprise polysilicon, a metal material or a combination thereof. It should be noted that these are only examples, and should not be considered as limitations to the stnicture, material or formation method of the gate region.

According to an embodiment of the present invention, the semiconductor region 212 may be formed by an element semiconductor or a compound semiconductor, e.g., SiGe, SiC, InAs, GaN, AlGaN, InP or any combination thereof, or may be formed by a doped or un-doped semiconductor material, which may react with a metal material deposited subsequently to form a metal-semiconductor compound region. In some embodiments, the semiconductor region 212 may be formed from the substrate 200 of a semiconductor material. For example, the semiconductor region 212 may be formed by a source/drain region 208 formed in the substrate 200, with a portion that is not covered by the gate region 210 being the semiconductor region 212. The substrate 200 may be an n-type or p-type doped semiconductor substrate such as n-type doped silicon and p-type doped silicon. In some other embodiments, the semiconductor region 212 may be formed by a source/drain embedded in the substrate by epitaxial growth, e.g., an embedded source/drain formed by e-SiGe, e-SiGeC or the like. In some other embodiments, the semiconductor region 212 may also be a semiconductor layer formed on the substrate 200, for example, a semiconductor layer (not shown in the figure) formed on the substrate 200 by epitaxial growth or a silicon-containing semiconductor layer formed by another method.

In the embodiment as shown in FIG. 3, the substrate 200 is a monocrystalline silicon substrate, the gate region 210 comprises a gate dielectric layer, a gate electrode 202, a cap layer 204 on the gate dielectric layer and gate electrode 202, and spacers 206 on the sidewalls of the gate dielectric layer and gate electrode 202, and the semiconductor region 212 is formed by a source/drain region 208 that is not covered by the gate region 210, and is made of n-type or p-type doped monocrystalline silicon.

The gate region 210 and the source/drain region 208 may be formed by any suitable method in the prior art.

Specifically, in an embodiment, the gate dielectric layer and gate electrode 202 and the cap layer 204 are formed sequentially and patterned; then, dielectric spacers 206 having a one-layer or multi-layered structure such as $SiO_2$ and $Si_3N_4$ are formed on the sidewalls of the gate dielectric layer and gate electrode 202; and processes such as ion implantation and annealing are performed according to the type of the device to form a source/drain region 208 in the substrate 200 at both sides of the gate region 210.

In the embodiment, the source/drain region 208 that is not covered by the gate region 210 is the semiconductor region 212 where the silicide will be formed subsequently.

Figure 5:
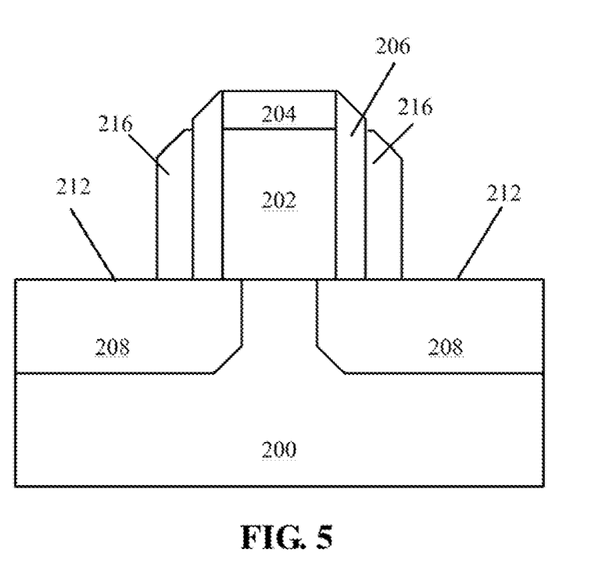

At step S2, sacrificial spacers 216 covering a portion of the semiconductor region 212 are formed on sidewalls of the gate region 210, as shown in FIG. 5.

According to an embodiment of the present invention, the thickness of the sacrificial spacers may be configured according to specific requirements of the device, e.g., the value of the contact resistance or the influence caused by metal silicatization.

According to an embodiment of the present invention, the sacrificial spacers may be OctadecylTrichlorosilane (OTS) or Dodecyltrichlorosilane (DTS) spacers, and may be formed by depositing a sacrificial material layer and then etching the sacrificial material layer.

In an embodiment, the sacrificial spacers are OTS spacers, and a monomolecular OTS film may be formed on the spacers 206 by a self-assembly process.

Specifically, the OTS sacrificial spacers may be formed by the following steps.

Figure 4:
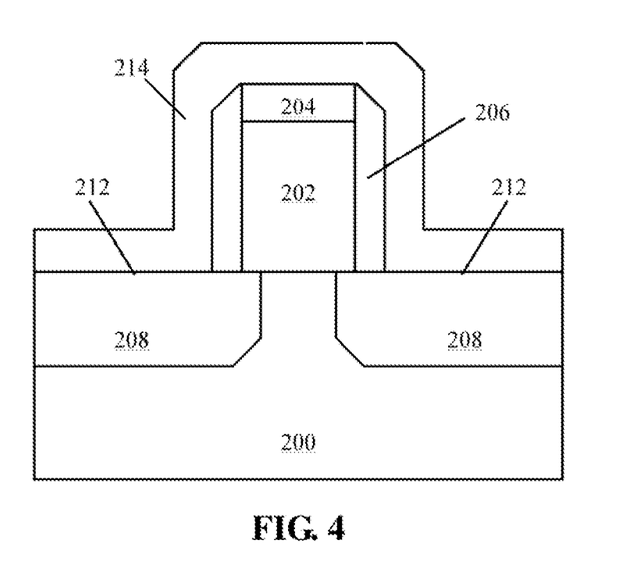

Firstly, the device above is placed into an OTS solution at room temperature and a humidity of about 80% for a period of time such as about 10 minutes. As a result, an OTS film 214 is formed on the surfaces of the semiconductor region 212 and the gate region 210, as shown in FIG. 4.

Then, a portion of the OTS film 214 is removed by etching, e.g., reactive-ion etching (RIE), so as to form, on the sidewalls of the gate region 210, the OTS sacrificial spacers 216 covering a portion of the semiconductor region 212, as shown in FIG. 5. This method for forming the sacrificial spacers is only an example, which should not be considered as limiting the present invention.

Figure 6:
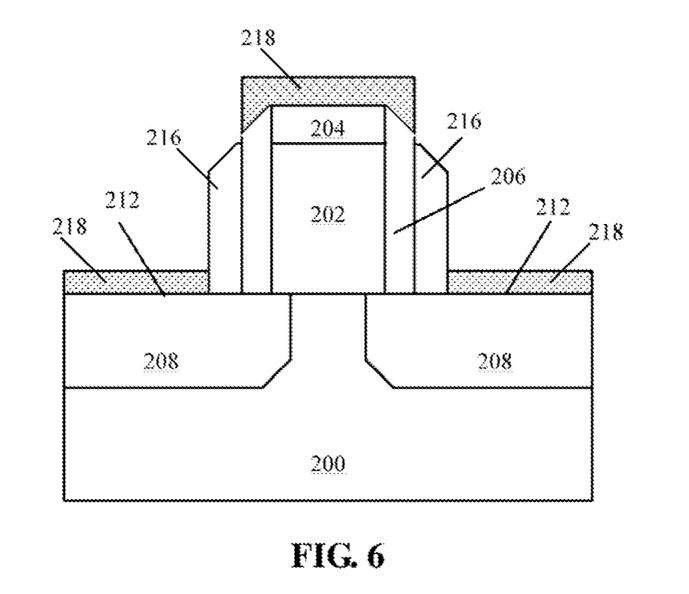

At step S3, a metal layer 218 is formed on a portion of the semiconductor region 212 outside the sacrificial spacers 216 and on the gate region 210, as shown in FIG. 6.

According to an embodiment of the present invention, the metal layer 218 may be a metal material comprising Ni, e.g., Ni, an Ni—Pt alloy, or a combination thereof. The metal layer 218 may also be a metal having similar diffusion property. The metal layer 218 may also be formed by other suitable methods such as Atomic Layer Deposition (ALD), metal organic chemical vapor deposition (MOCVD) and physical vapor deposition (PVD).

In an embodiment, the metal layer may be selectively formed on a portion of the semiconductor region 212 outside the sacrificial spacers 216 and on the gate region 210 by an ALD method. In other words, the metal layer 218 is formed only on an exposed portion of the semiconductor region 212 and the gate region 210 except on the sacrificial spacers 216, as shown in FIG. 6. Specifically, in an embodiment, the metal layer 218 may be Ni, and the Ni metal layer 218 may be formed by an Ni precursor $Ni(dmamb)_2$ reacting with $NH_3$. The temperature in the reaction chamber may be about 70° C., $Ni(dmamb)_2$ may be carried by Ar gas into the reaction chamber at a flow rate of about 50 sccm, the temperature of the substrate 200 may be kept at 300° C., and the thickness of the formed metal layer may be about 2 nm to 20 nm. Optionally, the carrier gas of $Ni(dmamb)_2$ may be mixed with metal particles such as Pt and Ru, so as to form a metal layer comprising an alloy material.

Figure 7:
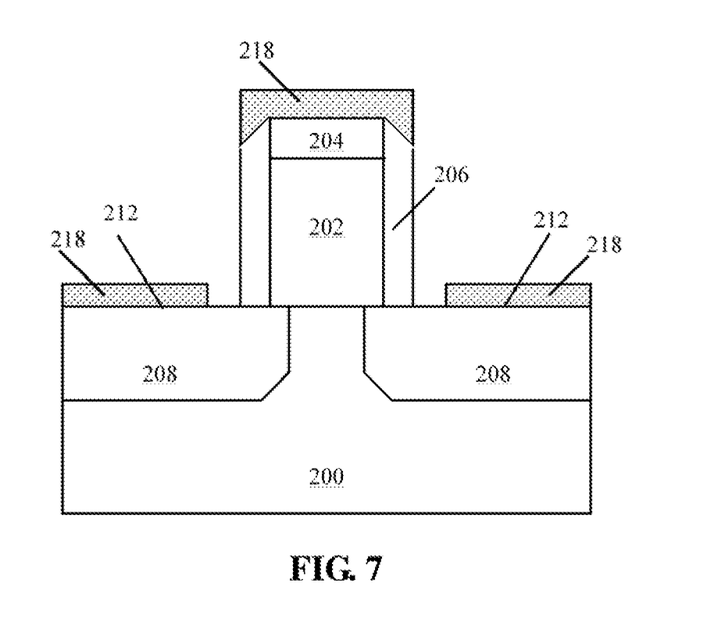

At step S4, the sacrificial spacers 216 are removed, as shown in FIG. 7.

The sacrificial spacers 216 may be removed by dry-etching or wet-etching.

By forming the sacrificial spacers before formation of the metal material, and removing the sacrificial spacers after the metal layer is formed, there is a distance between the metal layer and both the gate region and the channel. Hence, the distance for the metal layer to diffuse (lateral diffusion) to the channel and the gate region increases. In addition, by determining the thickness of the sacrificial spacers, i.e., the distance between the metal layer and the gate region, according to requirements of device design, e.g., size of the device or resistivity requirements, the effect of metal layer diffusion on the channel and the gate region during metal silicatization is reduced, and performance of the device is improved.

In the embodiment, the OTS sacrificial spacers may be removed by washing with deionized water.

At step S5, annealing is performed so that the metal layer reacts with the semiconductor region to form a metal-semiconductor compound layer 220 on the semiconductor region 212.

The metal-semiconductor compound layer 220 may be formed by a Rapid Thermal Annealing (RTA) method. Preferably, the annealing temperature may be about 200-500° C. the metal-semiconductor compound layer 220 of a low resistivity such as Ni silicon and Ni—Pt silicon is formed by performing annealing once, and the annealing time may be about 5-10 seconds. The formation of the silicide layer by performing annealing once can simplify the process and reduce manufacturing costs. In addition, since the metal layer is separated from the gate region and the channel by the sacrificial spacers, lateral diffusion is effectively reduced during the formation of the metal-semiconductor compound layer by annealing, thereby improving performance of the device.

Figure 8:
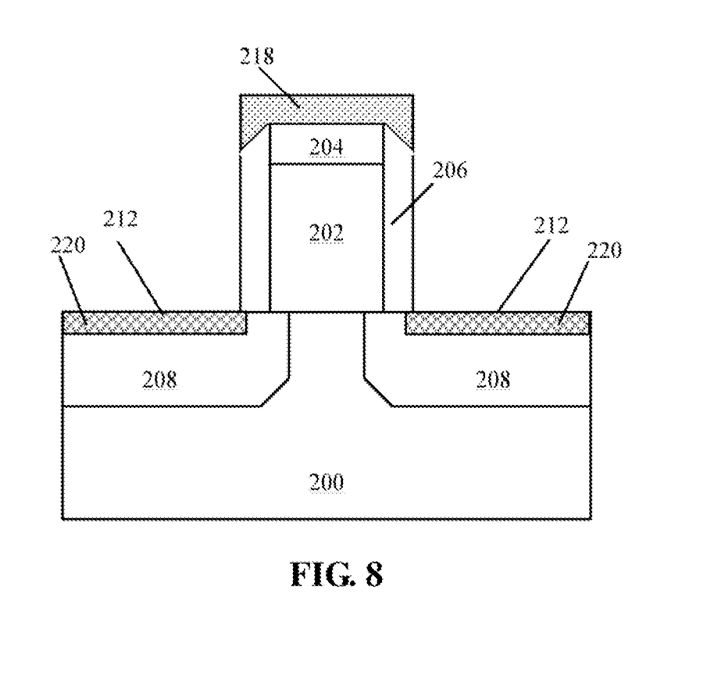
Figure 9:
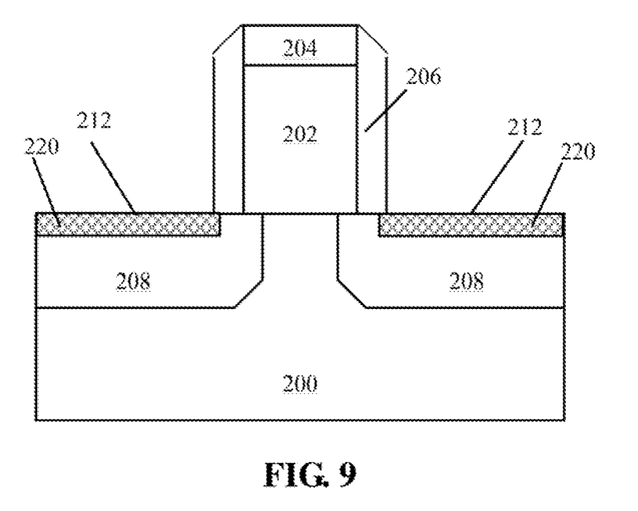

At step S6, the unreacted metal layer is removed, as shown in FIG. 8.

The unreacted metal layer may be removed by a wet-etching method, while the metal-semiconductor compound layer is kept. The unreacted metal layer may be the metal layer on the gate region, or may be the metal layer on the gate region and unreacted metal layer on the semiconductor region.

In the embodiment, the unreacted metal layer may be removed using aqua regia.

It should be noted that, in a gate-last process, this step may be performed at the same time when the sacrificial gate stack is removed, which not only can reduce processing steps, but also can better protect the metal-semiconductor compound layer.

Then, subsequent processing processes for the device, such as formation of an inter-dielectric layer, a contact and subsequent interconnects, may be performed.

The descriptions above are merely preferred embodiments of the present invention, and should not be considered as limiting the present invention in any ways.

Preferred embodiments of the present invention are disclosed above, and should not be considered as limiting the scope of the invention. Various alternations and modifications may be made to the technical solution of the invention by those skilled in the art based on the technical disclosure herein without deviation from the scope of the invention. Hence, any alternations, equivalents, or modifications made to the embodiments disclosed herein based on the technical essential of the invention without deviation from the scope of the invention should fall within the scope of the invention.

The invention claimed is:

1. A method for manufacturing a semiconductor device, comprising:
 providing a substrate, a gate region on the substrate and a semiconductor region at both sides of the gate region;
 forming sacrificial spacers, which cover a portion of the semiconductor region, on sidewalls of the gate region;
 forming a metal layer on a portion of the semiconductor region outside the sacrificial spacers and on the gate region;
 removing the sacrificial spacers;
 after removing the sacrificial spacers, performing annealing so that the metal layer reacts with the semiconductor region to form a metal-semiconductor compound layer on the semiconductor region; and
 removing unreacted petal layer.

2. The method according to claim 1, wherein the metal layer is a metal material comprising Ni.

3. The method according to claim 2, wherein the metal layer comprises Ni, Ni—Pt alloy, or a combination thereof.

4. The method according to claim 1, wherein the semiconductor region comprises: Si, SiGe, SiC, InAs GaN, AlGaN, InP, or any combination thereof.

5. The method according to claim 1, wherein the semiconductor region is a source/drain region on a doped substrate, a source/drain region embedded in the substrate, or a semiconductor layer on the substrate.

6. The method according to claim 1, wherein the formed sacrificial spacers are OctadecylTrichlorosilane (OTS) sacrificial spacers or Dodecyltrichlorosilane (DTS) sacrificial spacers.

7. The method according to claim 6, wherein the OTS sacrificial spacers are formed by: placing the gate region and the semiconductor region into an OTS solution to form an OTS film on a surface of the semiconductor region and a surface of the gate region; and selectively removing the OTS film so as to form the OTS sacrificial spacers, which cover a portion of the semiconductor region, on sidewalls of the gate region.

8. The method according to claim 1, wherein the metal layer is formed selectively forming the metal layer on a portion of the semiconductor region outside the sacrificial spacers and on the gate region.

9. The method according to claim 1, wherein the annealing is performed at a temperature ranging from about 200 to 500° C.

10. The method according to claim 1, wherein the annealing is performed for a period of time ranging from about 5 to 10 seconds.

11. The method according to claim 4, wherein the semiconductor region is a source/drain region on a doped substrate, a source/drain region embedded in the substrate, or a semiconductor layer on the substrate.

* * * * *

UNITED STATES PATENT AND TRADEMARK OFFICE
CERTIFICATE OF CORRECTION

PATENT NO. : 8,642,433 B2  
APPLICATION NO. : 13/509551  
DATED : February 4, 2014  
INVENTOR(S) : Huicai Zhong et al.

Page 1 of 1

It is certified that error appears in the above-identified patent and that said Letters Patent is hereby corrected as shown below:

ON THE TITLE PAGE:

Item (73) Assignee:

Delete "INSTITUTE OF MICROELECTRONICS, ACADEMY OF SCIENCES"
and insert:
-- INSTITUTE OF MICROELECTRONICS, CHINESE ACADEMY OF SCIENCES --

Signed and Sealed this
Third Day of February, 2015

Michelle K. Lee
*Deputy Director of the United States Patent and Trademark Office*